(12) United States Patent
Hernes

(10) Patent No.: US 8,736,471 B2
(45) Date of Patent: May 27, 2014

(54) METHODS AND APPARATUS FOR CALIBRATING STAGES IN PIPELINE ANALOG-TO-DIGITAL CONVERTERS

(75) Inventor: Bjornar Hernes, Trondheim (NO)

(73) Assignee: Hittite Microwave Corporation, Chelmsford, MA (US)

( * ) Notice: Subject to any disclaimer, the term of this patent is extended or adjusted under 35 U.S.C. 154(b) by 0 days.

(21) Appl. No.: 13/591,784

(22) Filed: Aug. 22, 2012

(65) Prior Publication Data
US 2014/0055295 A1 Feb. 27, 2014

(51) Int. Cl.
H03M 1/10 (2006.01)
(52) U.S. Cl.
USPC ........... 341/120; 341/155; 341/161; 341/118; 341/119
(58) Field of Classification Search
CPC ....................................................... H03M 1/10
USPC .......................... 341/155, 161, 120, 118, 119
See application file for complete search history.

(56) References Cited

U.S. PATENT DOCUMENTS

| 5,465,092 | A | 11/1995 | Mayes et al. |
| 6,184,809 | B1 | 2/2001 | Yu |
| 6,198,423 | B1 | 3/2001 | Yu |
| 6,366,230 | B1 | 4/2002 | Zhang et al. |
| 6,486,807 | B2 | 11/2002 | Jonsson |
| 6,489,904 | B1 | 12/2002 | Hisano |
| 6,563,445 | B1 | 5/2003 | Sabouri |
| 6,567,025 | B2 | 5/2003 | Schreier et al. |
| 6,700,403 | B1 | 3/2004 | Dillon |
| 6,975,950 | B2 | 12/2005 | Bardsley |
| 7,002,504 | B2 * | 2/2006 | McMahill ..................... 341/161 |
| 7,015,842 | B1 | 3/2006 | Gupta et al. |
| 7,107,175 | B2 * | 9/2006 | Maloberti et al. ............ 702/126 |
| 7,126,508 | B2 | 10/2006 | Seki |
| 7,209,068 | B1 * | 4/2007 | Chen et al. .................... 341/161 |
| 7,221,299 | B2 | 5/2007 | Bjornsen |
| 7,312,734 | B2 | 12/2007 | McNeill et al. |
| 7,495,596 | B2 | 2/2009 | Kim et al. |
| 7,551,114 | B2 | 6/2009 | Joy et al. |
| 7,573,417 | B2 | 8/2009 | Bailey et al. |
| 7,741,987 | B2 | 6/2010 | Yung et al. |
| 2009/0201051 | A1 | 8/2009 | Ono et al. |

FOREIGN PATENT DOCUMENTS

WO 02/069501 A1 9/2002
WO 2011/051763 A1 5/2011

OTHER PUBLICATIONS

Hernes et al., "A 92.5mW 205MS/s 10b Pipeline IF ADC Implemented in 1.2V/3.3V 0.13mm CMOS," 2007 IEEE International Solid-State Ciruits Conference, Digest of Technical Papers, Feb. 14, 2007, pp. 462-463 and 615.
Sumanen et al., "A 10-bit 200-MS/s CMOS Parallel Pipeline A/D Converter," IEEE Journal of Solid-State Circuits, vol. 36, No. 7, Jul. 2001, pp. 1048-1055.
International Search Report and Written Opinion for PCT/IB2013/002609, dated Apr. 4, 2014.

* cited by examiner

Primary Examiner — Jean B Jeanglaude
(74) Attorney, Agent, or Firm — Rajesh Vallabh; Foley Hoag LLP

(57) ABSTRACT

A calibration control circuit is provided for calibrating a stage in a pipeline analog-to-digital converter (ADC). The stage includes an analog-to-digital subconverter (ADSC) and a multiplying digital-to-analog converter (MDAC). The calibration control circuit includes circuitry coupled to comparators in the ADSC to force the comparators to output a predetermined digital output signal set by a calibration control signal when the ADC is in a calibration mode to thereby control reference switches in an analog multiplexer (AMUX) to selectively apply reference voltages to capacitors in the MDAC to obtain a predetermined stage residue signal.

13 Claims, 8 Drawing Sheets

METHODS AND APPARATUS FOR CALIBRATING STAGES IN PIPELINE ANALOG-TO-DIGITAL CONVERTERS

BACKGROUND

The present application relates generally to analog-to-digital conversion and, more particularly, to calibrating stages in pipeline analog-to-digital converters (ADCs).

Pipeline ADCs are a preferred architecture for medium to high speed, high resolution ADCs. They have low power consumption and relatively low comparator accuracy compared to flash ADCs and high throughput due to the pipelining of lower accuracy stages compared to cyclic ADCs. A pipeline ADC is a switched capacitor circuit relying on capacitor matching and high op-amp open loop gain to achieve high accuracy. In applications where distortion must be very low, calibration of capacitor mismatches and finite op-amp open loop gain is needed. Ideally, the calibration circuitry does not substantially increase the complexity of the design or impact operation speed. However, in practical implementations, the additional circuitry needed for calibration is significant and may severely limit obtainable conversion speed.

BRIEF SUMMARY OF THE DISCLOSURE

In accordance with one or more embodiments, a calibration control circuit is provided for calibrating a stage in a pipeline analog-to-digital converter (ADC). The stage includes an analog-to-digital subconverter (ADSC) and a multiplying digital-to-analog converter (MDAC). The ADSC includes a plurality of comparators for comparing an input analog signal to reference values to obtain a digital output signal resolving a given number of bits of the input signal when the ADC is in an operation mode. The MDAC converts the digital output signal from the ADSC to an analog signal and subtracts it from the sampled input analog signal and amplifies the result to obtain a stage residue signal when the ADC is in an operation mode. The MDAC includes an analog multiplexer (AMUX) comprising a plurality of reference switches controlled by the digital output signal from the ADSC for selectively applying reference voltages to capacitors in the MDAC. The calibration control circuit comprises circuitry coupled to the comparators in the ADSC to force the comparators to output a predetermined digital output signal set by a calibration control signal when the ADC is in a calibration mode to thereby control the reference switches in the AMUX to selectively apply reference voltages to the capacitors in the MDAC to obtain a predetermined stage residue signal.

In accordance with one or more further embodiments, a method is provided for calibrating a stage in a pipeline analog-to-digital converter (ADC). The stage includes an analog-to-digital subconverter (ADSC) and a multiplying digital-to-analog converter (MDAC). The ADSC includes a plurality of comparators for comparing an input analog signal to reference values to obtain a digital output signal resolving a given number of bits of the input signal when the ADC is in an operation mode. The MDAC converts the digital output signal from the ADSC to an analog signal and subtracts it from the sampled input analog signal and amplifies the result to obtain a stage residue signal when the ADC is in an operation mode. The MDAC includes an analog multiplexer (AMUX) comprising a plurality of reference switches controlled by the digital output signal from the ADSC for selectively applying reference voltages to capacitors in the MDAC. The method comprises: receiving a calibration control signal when the ADC is in a calibration mode; and forcing the comparators to output a predetermined digital output signal set by the calibration control signal to thereby control the reference switches in the AMUX to selectively apply reference voltages to the capacitors in the MDAC to obtain a predetermined stage residue signal.

DETAILED DESCRIPTION

Figure 1:
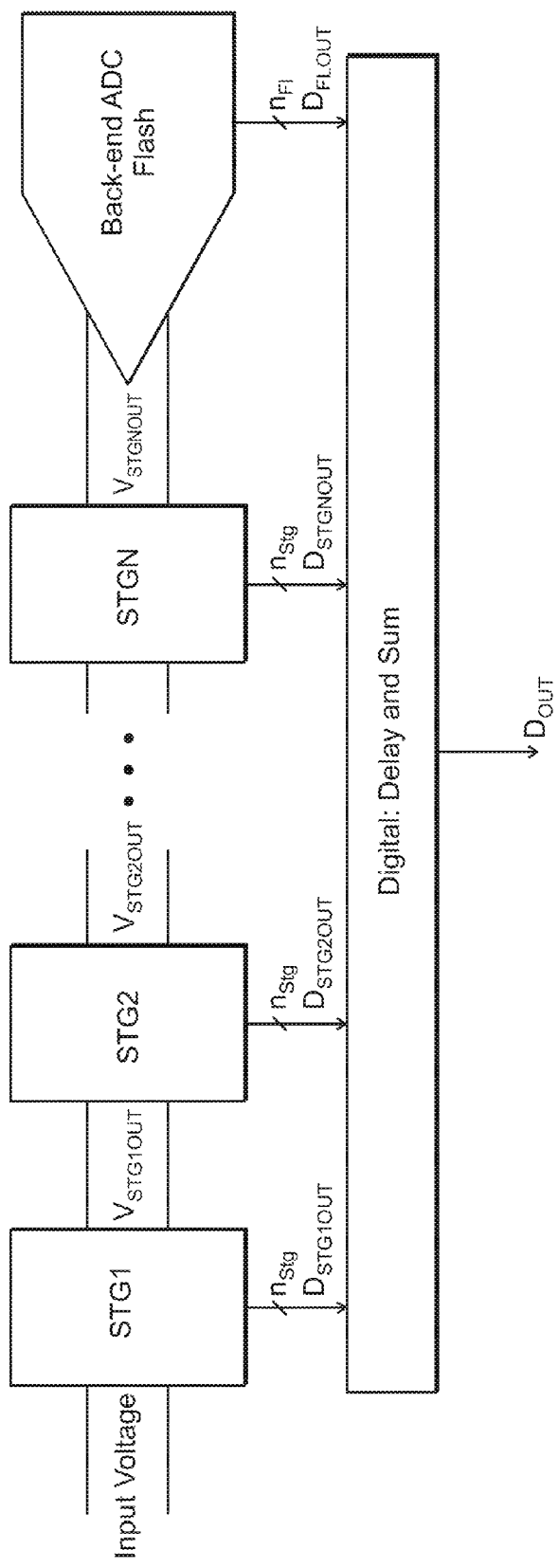
FIG. 1 is a schematic diagram illustrating a standard pipeline ADC structure.

FIG. 1 is a simplified block diagram illustrating a known pipeline ADC. An analog input voltage is applied to the first stage STG1 in the pipeline ADC. STG1 resolves $ns_{tg}$ bits of the input signal, and this digital value is delivered to a digital delay and sum block. The rest of the analog input signal is gained and appears at the stage analog output delivered to the subsequent stage, STG2. This operation is synchronized such that the input sample of the analog input voltage propagates through the pipeline chain, so when the previous sample is processed by STG2, a new sample is processed by STG1. An ordinary flash structured ADC is often utilized at the end of the pipeline chain. In general, the resolution of each stage can be different, but because the structure is repeating, it is common to reuse stages, especially in the back of the chain.

Figure 2:
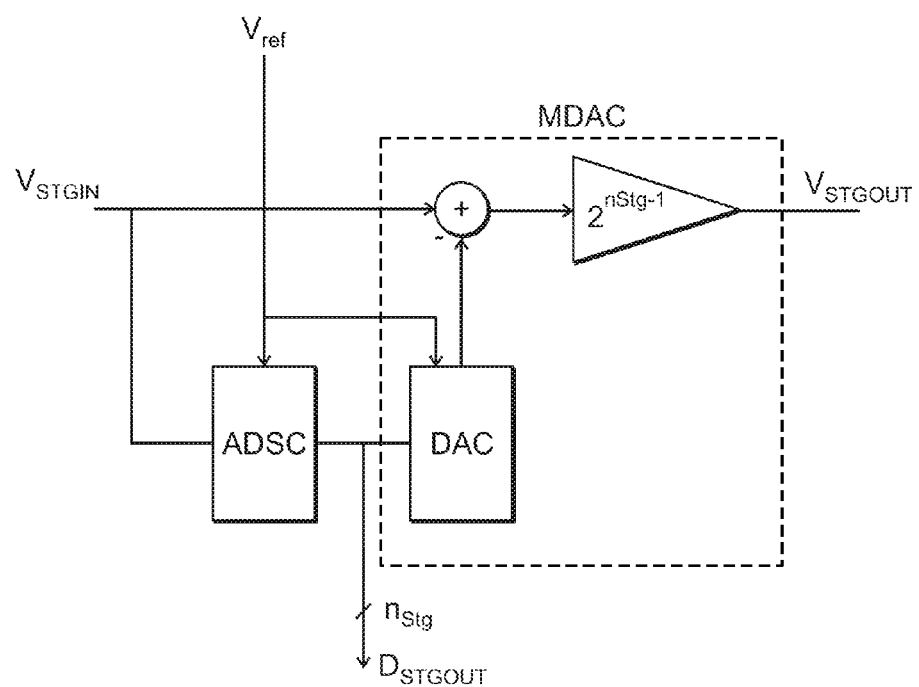
FIG. 2 is a schematic diagram illustrating the general stage structure in a pipeline ADC.

FIG. 2 shows the general functionality of a known pipeline stage. The stage input voltage $V_{STGIN}$ is sampled in the multiplying digital-to-analog-converter (MDAC) and in the analog-to-digital subconverter (ADSC) at the same time instance. The ADSC includes of a number of comparators with reference voltages depending on the number of bits in the stage. The ADSC compares the sampled input signal to a reference voltage, VREF, and then provides a digital value $D_{STGOUT}$ as a result of the comparison. $D_{STGOUT}$ is then applied to the MDAC and the delay and sum circuit shown in FIG. 1. The MDAC converts $D_{STGOUT}$ back to the analog domain, and subtracts it from $V_{STGIN}$. The resulting analog output voltage represents the stage quantization error. The quantization error is then gained by the factor $2^{nStg}-1$, where $ns_{tg}$ is the number of output bits of the stage. The resulting stage output voltage is called the stage residue.

Because of the gain larger than 1 of each stage, the first stage, which samples the ADC input voltage, has the highest requirements with respect to noise and accuracy. The stages down the pipeline chain will have relaxed specifications. Therefore, the initial stages of the pipeline ADC most require calibration to fulfill the overall distortion specification of the ADC.

Figure 3:
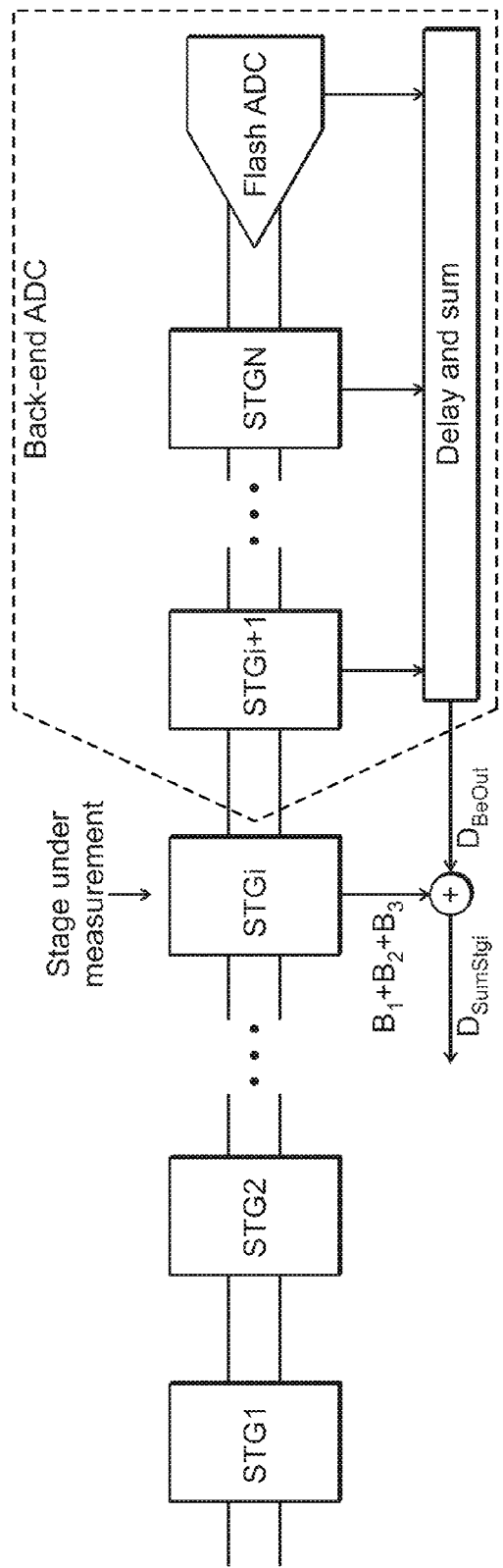
FIG. 3 is a schematic diagram illustrating calibration measurement in a pipeline ADC.

FIG. 3 shows a prior art implementation of a calibration scheme where a Back-end ADC is used to measure the output of stage STGi. The stage under calibration, STGi, is operated in a calibration mode and is forced to output voltage levels specific to the implemented calibration scheme. These voltages are measured by the Back-end ADC, and the digital output, $D_{BeOut}$, is used by a calibration algorithm.

Figure 4:
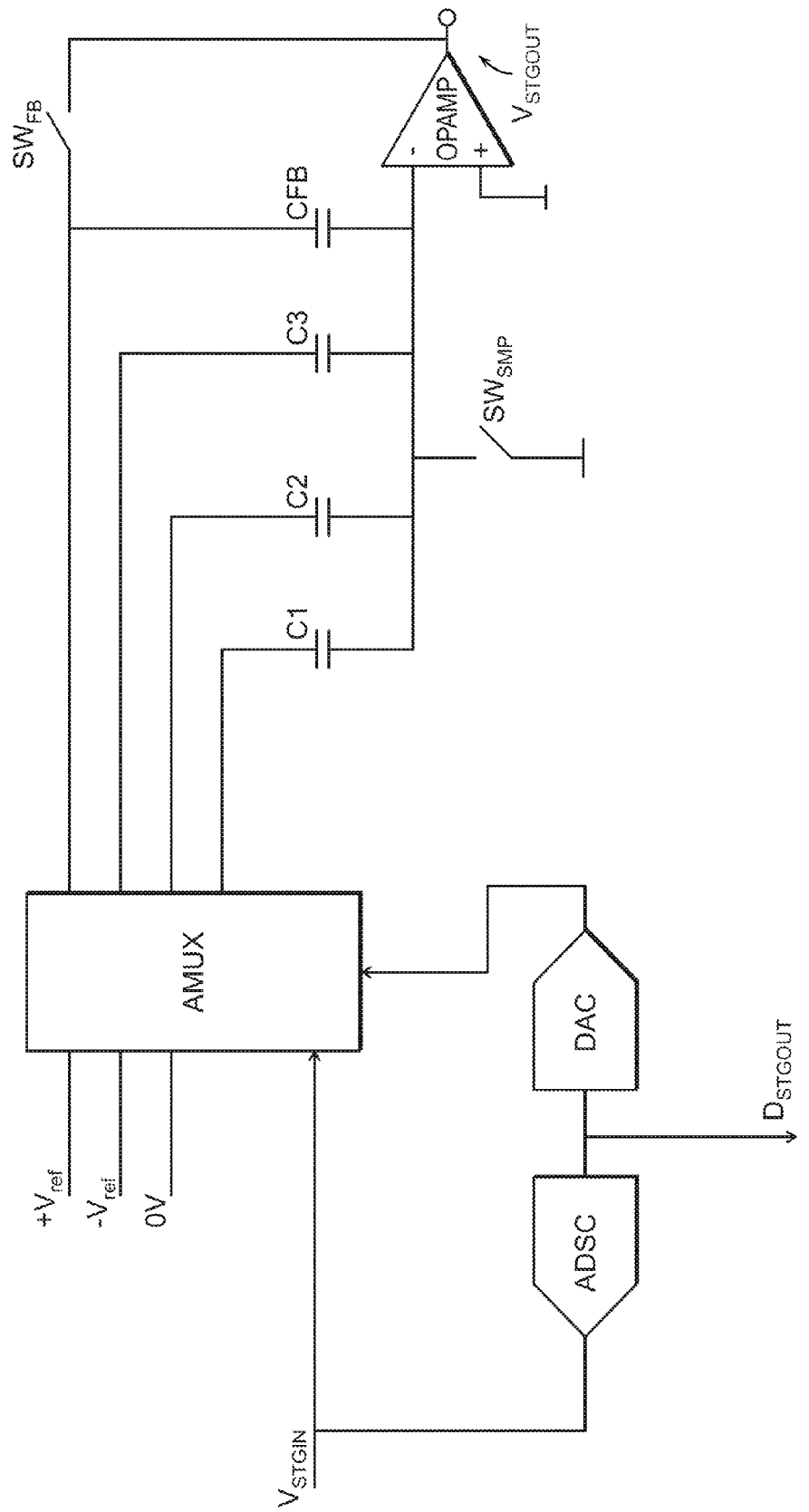
FIG. 4 is a schematic diagram illustrating a pipeline ADC stage in an operation mode.

A stage in normal operational mode is shown in FIG. 4. In the stage Sampling Phase, the capacitors C1, C2, C3, and CFB are all connected to the input voltage such that the voltage across the capacitors is tracking the input voltage. At the end of the Sampling Phase, switch $SW_{SMP}$ is opened and the stage input voltage is stored across the capacitors. At the same time the stage input voltage is sampled by the ADSC and compared to the reference voltages. The result of the comparison is a digital value $D_{STGOUT}$ delivered to the delay and sum circuit of FIG. 1 and to the stage digital-to-analog converter (DAC). In the next clock phase, the DAC steers the analog multiplexer (AMUX) such that the top of C1, C2, and C3 is connected to +Vref, −Vref, or zero depending on $D_{STGOUT}$. Further, in this phase $SW_{FB}$ is closed, wrapping CFB around the op-amp.

Figure 5:
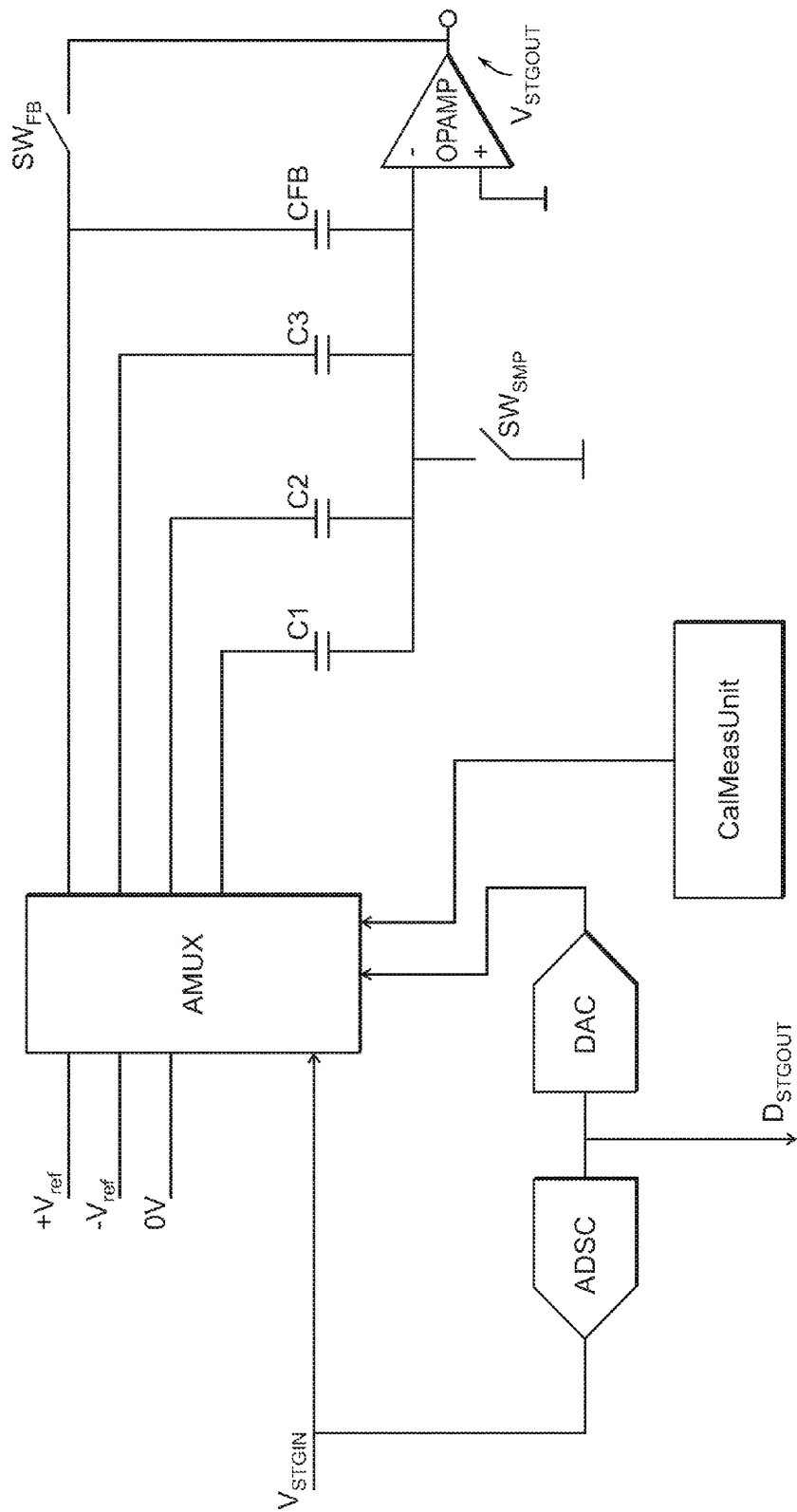
FIG. 5 is a schematic diagram illustrating a pipeline ADC stage in a calibration mode.

Referring now to FIG. 5, two different variations of a calibration procedure are described. When the capacitor mismatches, finite op-amp gain, and stage offset are measured, the stage operation is a little different compared to normal operation. In the Sampling Phase, the reference voltages are applied to the top of one of the capacitors C1, C2, C3, and CFB through the AMUX controlled by a calibration measurement unit (CalMeasUnit). The rest of the capacitors are connected to zero voltage. In the next phase, the Hold Phase, the ADSC and the DAC are inactive, and C1, C2, and C3 are connected to zero voltage, while CFB is connected to the op-amp output. The stage output voltage is now applied to the back-end ADC as shown in FIG. 3, which is sampling and quantizing this voltage.

An alternative calibration approach is to discharge all capacitors C1, C2, C3, and CFB by connecting them to zero voltage, 0V, through the AMUX in the sampling phase. The AMUX is controlled by CalMeasUnit. In the Hold Phase, the ADSC and the DAC are inactive. The CFB is connected to the op-amp output, and one of the capacitors C1 to C3 is connected to a reference voltage, and the rest kept at zero voltage. Similarly CFB can be measured by connecting CFB to the reference voltage, and one of the other capacitors is used as feedback capacitor. The other capacitors are connected to zero. The stage output voltage is connected to the back-end ADC as shown in FIG. 3, which is sampling and quantizing this voltage. And the output digitized voltage from the back-end ADC is then used for calculating calibration coefficients.

In both these calibration procedures, the ADSC digital output signal in the AMUX must be overridden and the functionality altered from normal operation. In normal operation, the switches in the AMUX are directly controlled by the digital output from the ADSC through the DAC as shown in FIG. 4. In order to override the digital output from the ADSC by the CalMeasUnit, the logic controlling the switches must be extended. This results in a greater logic depth in the switch control logic. Greater logic depth is disadvantageous since it will increase the total delay from the comparator decision until the switch is toggled. This will limit the maximum operation speed of the pipeline stage.

Figure 6:
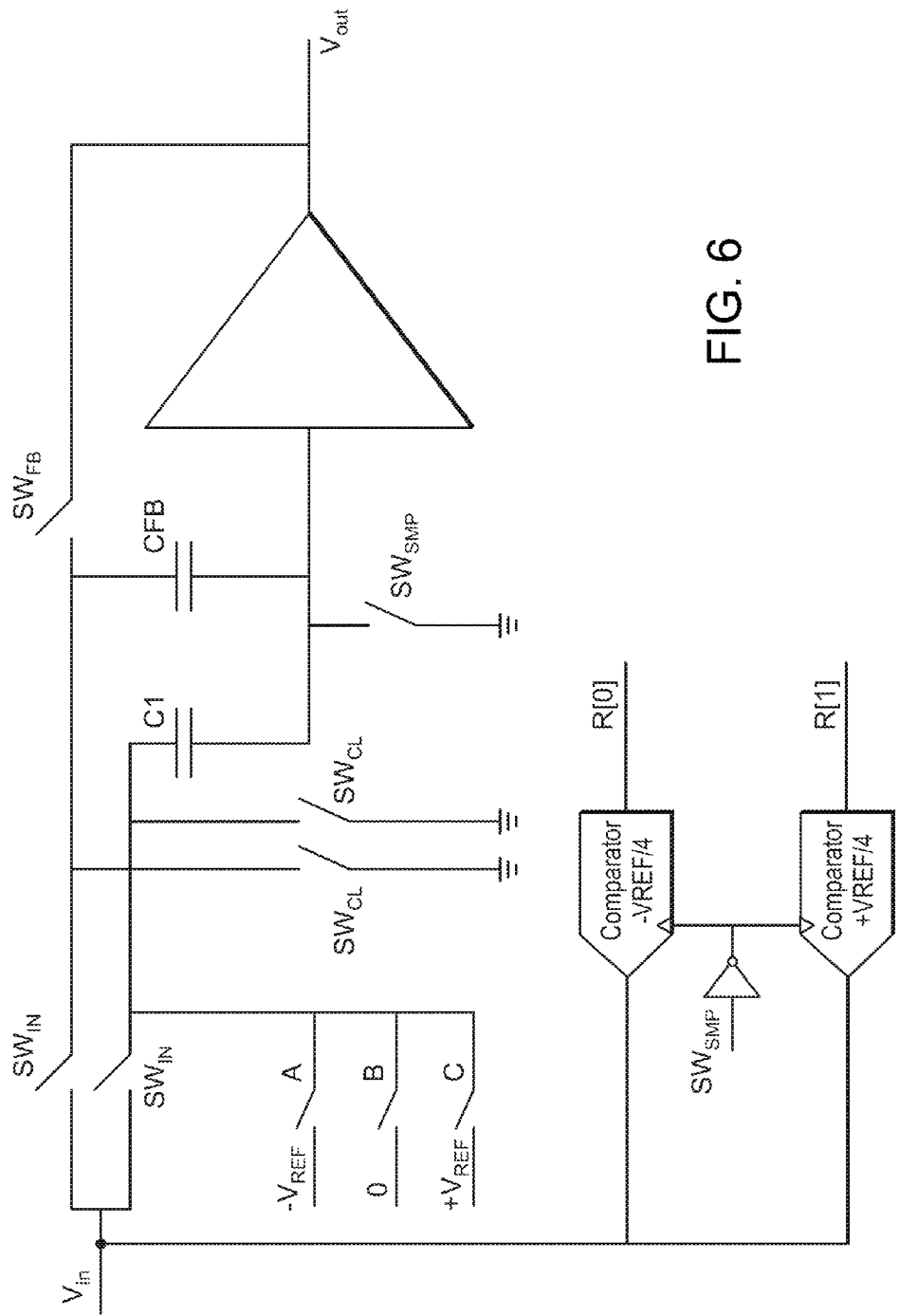
FIG. 6 is a schematic diagram illustrating a simplified 1.5 bit per stage pipeline stage architecture.

Due to its simplicity, a 1.5b stage will be used for the further explanation of stage operation. The operation is equivalent or similar for other stage resolutions even though the complexity is higher The 1.5 pipeline stage in FIG. 6 illustrates prior art calibration. The figure lacks some of the detail required to perform full calibration. It is simplified to show the principles of controlling switches in the CalMeasUnit.

In Normal Operation, the input signal is sampled on both capacitors C1 and CFB by closing switches labeled $SW_{IN}$ and $SW_{SMP}$ in the Sampling Phase. In the Hold Phase, the switch labeled $SW_{FB}$ is closed, and the reference switches A, B, and C are closed based on the decision in the comparators and the resulting values present on R[1,0], which normally are used to generate the digital stage output, $D_{STGOUT}$. The comparators latch at the same point in time where the switch $SW_{SMP}$ is opened, which is at the end of the Sampling Phase. Switch A is closed in the left segment of the transfer curve of the stage shown in FIG. 7. Switches B and C are closed in the middle and right segments, respectively.

Figure 7:
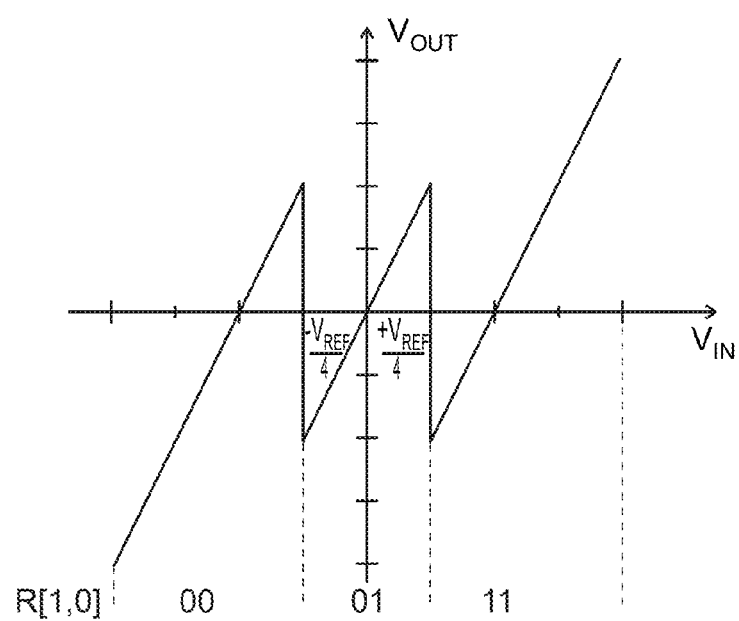
FIG. 7 is a graph illustrating a transfer curve for 1.5 bit per stage pipeline stage.

Referring to FIG. 7, assume that the clock signal $\phi 1$ is high in the Sampling Phase and low in the Hold Phase, and the clock signal $\phi 2$ is high in the Hold Phase and low in the Sampling Phase. The Boolean expressions for A, B, and C are:

$$A = \phi 2 * !R[1] * !R[0]$$

$$B = \phi 2 * !R[1] * R[0]$$

$$C = \phi 2 * R[1] * R[0] \tag{1}$$

where "*" means logical AND, and "!" means inverted. So !R[1]=1 means that the most significant bit in R[1,0] is low. In many implementations, the direct control of switches A, B, and C by clock $\phi 2$ is omitted. This can be done since the comparator outputs are in a Reset State when the stage is in the Sampling Phase. An extra signal from the comparator can be used to indicate Reset State, and make sure all of the switches A, B, and C are open.

FIG. 6 shows the circuitry to measure the calibration coefficient for one of the capacitors, C1. A calibration measurement is described below according to the alternative calibration approach described above.

In the Sampling Phase, both capacitors will be discharged by closing the switches $SW_{SMP}$ and $SW_{CL}$. As a calibration measurement is intended to measure capacitor mismatch and other circuit non-idealities, the input switches, $SW_{IN}$, will remain open during a calibration measurement cycle to avoid impact from the input signal on the calibration measurement.

In the Hold Phase, switches $SW_{SMP}$ and $SW_{CL}$ will be opened and $SW_{FB}$ will be closed, and one of the switches A, B, or C will be closed, depending on the type of calibration measurement that is selected. In a typical implementation, switch A will be closed for a number of measurement cycles followed by a number of cycles where switch C is closed. For purposes of illustration, the case where only switch A is closed in the Hold Phase is discussed. An actual implementation will include more functionality in order to be able to measure all capacitor mismatches and other non-idealities. Multi bit per stage implementations, e.g., a 2.8 bit per stage design, will contain significantly more switches and capacitors, even though performing calibration in such situations may be even more important.

The full Boolean equation for switch A includes two more control signals, CalAct and ACsel. CalAct indicates that calibration is active when it is high, or if the stage is working in Normal Mode when the signal is low. ACsel selects closing Switch A when high and Switch C when low, but only in the calibration mode. The Boolean expression for Switch A then becomes:

$$A = \phi 2 * !R[1] * !R[0]) * !CalAct + \phi 2 * CalAct * ACsel) \tag{2}$$

Note that Switch A should be closed only in the Hold Phase. It is also in this case possible to omit using the clock φ2, and instead using the Reset State signal from the comparator to control the switches A, B, and C as explained above.

The logic depth is thereby increased by two levels. In practice, the increase will be higher since the circuitry in FIG. 5 is simplified. It would also be more complex in an implementation with a higher number of bits per stage.

Figure 8:
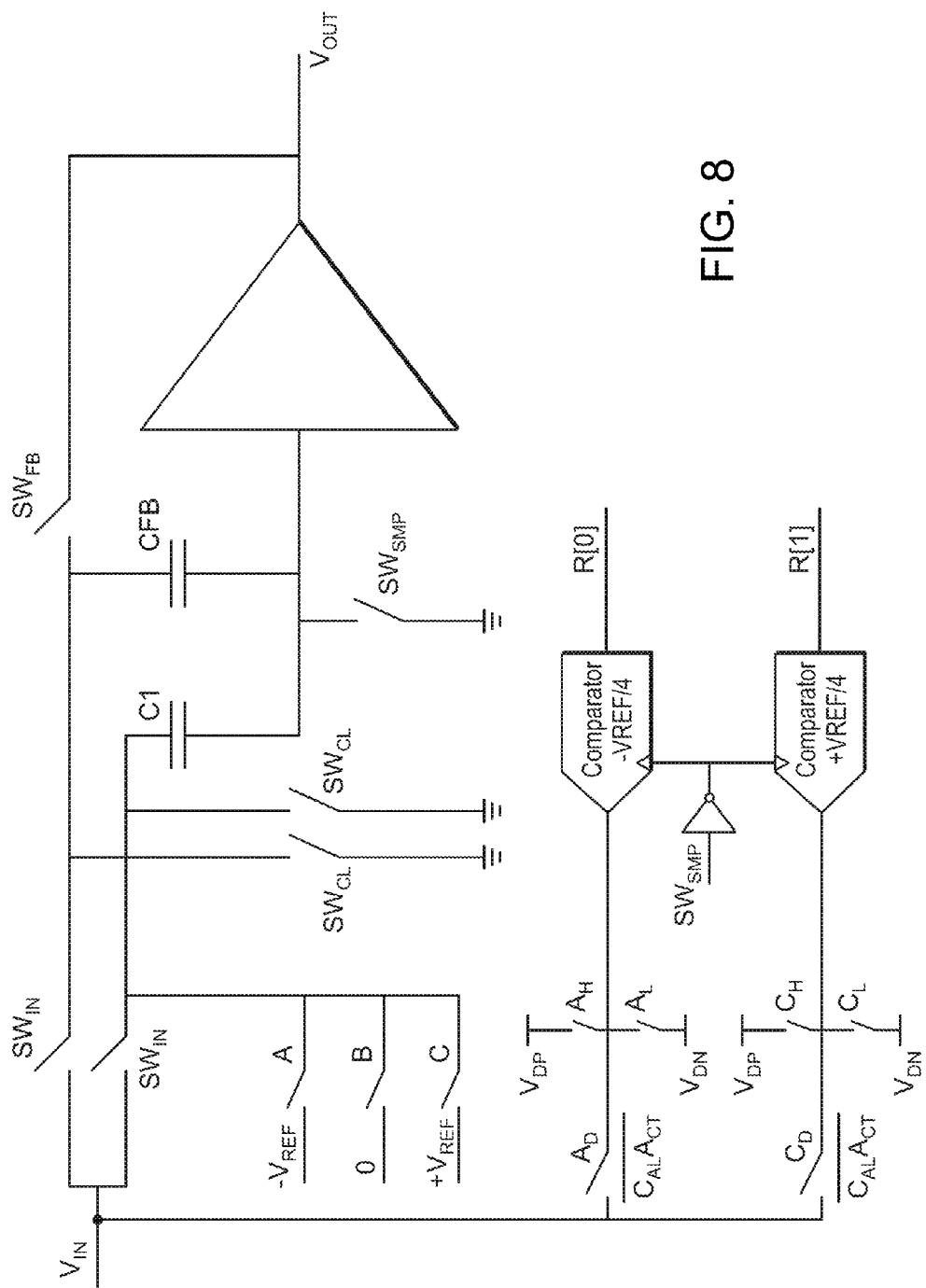
FIG. 8 is a schematic diagram illustrating an exemplary simplified 1.5 bit per stage pipeline ADC stage in accordance with one or more embodiments.

An exemplary implementation according to one or more embodiments is shown in FIG. 8. It is possible to force the comparator outputs R[1,0] to the desired values in order to avoid increasing the logic depth and complexity of the control logic, CalMeasUnit. Assume that the switches A, B, and C are controlled in the same way as during normal operation shown in FIG. 5. When the stage enters calibration mode, the CalAct signal goes high, and the switches AD and CD open, leaving the comparators disconnected from the input signal. The comparator outputs will now be independent of the value of the input signal. The voltages $V_{DP}$ and $V_{DN}$ are voltages higher and lower, respectively, than the threshold voltage of the comparator such that the comparator will output a high value, "1", when the switch AH is closed and a low value, "0", when the switch AL is closed. The other comparator will respond in the same way to switches CH and CL respectively.

In order to implement equation (2) with the structure in FIG. 8 in accordance with one or more embodiments, the Boolean expressions are fulfilled $$AD=CD=!CalAct$$

$$AH=CH=!ACsel*CalAct$$

$$CL=AL=ACsel*CalAct \quad (3)$$

In this way, when calibration is inactive, the switches AD and CD are closed and all switches to $V_{DP}$ and $V_{DN}$ are open. This results in normal operation of the stage.

When calibration is active, the switches AD and CD are open, disconnecting the input signal. For ACsel high, Switch A should be closed according to equation (2). Switch A will be closed when R[1,0]=00 or equivalently that both comparators output a low value.

If implementing the control of the switches AH, AL, CH and CL according to equation (3), switches AH and CH will be open and AL and CL will be closed in the calibration mode when ACsel is high. Both comparator outputs will then be low, resulting in R[1,0]=00. Similarly, the result will be R[1,0]=11 when ACsel is low, resulting in Switch C being closed when φ2 goes high.

Similar schemes can be made for any operation of switches A through C, or for other schemes with a higher number of switches.

As shown, the logic between the comparators and the switches is minimized by using a control scheme according to one or more embodiments. This scheme can be used to set the comparator outputs to an arbitrary value depending on what is desired in the design. It can therefore be adapted to generally any calibration scheme and to any number of bits in a stage. The scheme will in any case optimize the possible maximum operation frequency of the pipeline stage by eliminating or minimizing logic between the comparators and switches.

There are various ways of forcing the comparator outputs to specific values in calibration mode. It is possible to couple the inputs of the comparators to different voltages with switches or other circuitry. It is also possible to modify the comparator itself and alter the behavior dependent on certain control voltages.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments.

Additionally, elements and components described herein may be further divided into additional components or joined together to form fewer components for performing the same functions.

Accordingly, the foregoing description and attached drawings are by way of example only, and are not intended to be limiting.

What is claimed is:

1. A calibration control circuit for calibrating a stage in a pipeline analog-to-digital converter (ADC), the stage including an analog-to-digital subconverter (ADSC) and a multiplying digital-to-analog converter (MDAC), said ADSC including a plurality of comparators for comparing an input analog signal to reference values to obtain a digital output signal resolving a given number of bits of the input analog signal when the ADC is in an operation mode, said MDAC converting the digital output signal from the ADSC to an analog signal and subtracting it from the input analog signal and amplifying the result to obtain a stage residue signal when the ADC is in an operation mode, said MDAC including an analog multiplexer (AMUX) comprising a plurality of reference switches controlled by the digital output signal from the ADSC for selectively applying reference voltages to capacitors in the MDAC, wherein the calibration control circuit comprises:

circuitry coupled to the comparators in the ADSC to force said comparators to output a predetermined digital output signal set by a calibration control signal when the ADC is in a calibration mode to thereby control the reference switches in the AMUX to selectively apply reference voltages to the capacitors in the MDAC to obtain a predetermined stage residue signal.

2. The calibration control circuit of claim 1, wherein the circuitry coupled to the comparators includes a first set of switches actuated by a calibration actuation signal to switch operation of the ADC to a calibration mode by disconnecting the comparators from the input analog signal such that outputs of the comparators are independent of the input analog signal.

3. The calibration control circuit of claim 2, wherein the circuitry coupled to the comparators further includes a second set of switches coupled to the comparators in the ADSC for selectively controlling the digital output of each comparator to thereby control the reference switches in the AMUX to selectively apply reference voltages to the capacitors in the MDAC in the calibration mode.

4. The calibration control circuit of claim 3, wherein the second set of switches is controlled by the calibration control signal, wherein said second set of switches couple the input of each comparator to a voltage that is either higher or lower than a threshold voltage of the comparator in order to force the comparator to output a desired digital output signal.

5. A method for calibrating a stage in a pipeline analog-to-digital converter (ADC), the stage including an analog-to-digital subconverter (ADSC) and a multiplying digital-to-analog converter (MDAC), said ADSC including a plurality of comparators for comparing an input analog signal to reference values to obtain a digital output signal resolving a given number of bits of the input signal when the ADC is in an operation mode, said MDAC converting the digital output signal from the ADSC to an analog signal and subtracting it from the input analog signal and amplifying the result to obtain a stage residue signal when the ADC is in an operation mode, said MDAC including an analog multiplexer (AMUX) comprising a plurality of reference switches controlled by the digital output signal from the ADSC for selectively applying reference voltages to capacitors in the MDAC, the method comprising:

receiving a calibration control signal when the ADC is in a calibration mode; and forcing said comparators to output a predetermined digital output signal set by the calibration control signal to thereby control the reference switches in the AMUX to selectively apply reference voltages to the capacitors in the MDAC to obtain a predetermined stage residue signal.

6. The method of claim 5, further comprising receiving an actuation signal to switch operation of the ADC to a calibration mode by disconnecting the comparators from the input analog signal such that outputs of the comparators are independent of the input analog signal.

7. The method of claim 5, wherein the calibration control signal overrides the input analog signal.

8. The method of claim 5, wherein the calibration control signal controls a second set of switches coupled to the comparators in the ADSC to selectively control the digital output of each comparator to thereby control the reference switches in the AMUX to selectively apply reference voltages to the capacitors in the MDAC in the calibration mode.

9. The method of claim 8, wherein the second set of switches couple the input of each comparator to a voltage that is either higher or lower than a threshold voltage of the comparator in order to force the comparator to output a desired digital output signal.

10. A calibration control circuit for calibrating a stage in a pipeline analog-to-digital converter (ADC), the stage including an analog-to-digital subconverter (ADSC) and a multiplying digital-to-analog converter (MDAC), said ADSC including a plurality of comparators for comparing an input analog signal to reference values to obtain a digital output signal resolving a given number of bits of the input analog signal when the ADC is in an operation mode, said MDAC converting the digital output signal from the ADSC to an analog signal and subtracting it from the input analog signal and amplifying the result to obtain a stage residue signal when the ADC is in an operation mode, said MDAC including an analog multiplexer (AMUX) comprising a plurality of reference switches controlled by the digital output signal from the ADSC for selectively applying reference voltages to capacitors in the MDAC, wherein the calibration control circuit comprises:

means coupled to the comparators in the ADSC for forcing said comparators to output a predetermined digital output signal set by a calibration control signal when the ADC is in a calibration mode to thereby control the reference switches in the AMUX to selectively apply reference voltages to the capacitors in the MDAC to obtain a predetermined stage residue signal.

11. The calibration control circuit of claim 10, wherein the means coupled to the comparators includes a first set of switches actuated by a calibration actuation signal to switch operation of the ADC to a calibration mode by disconnecting the comparators from the input analog signal such that outputs of the comparators are independent of the input analog signal.

12. The calibration control circuit of claim 11, wherein the means coupled to the comparators further includes a second set of switches coupled to the comparators in the ADSC for selectively controlling the digital output of each comparator to thereby control the reference switches in the AMUX to selectively apply reference voltages to the capacitors in the MDAC in the calibration mode.

13. The calibration control circuit of claim 12, wherein the second set of switches is controlled by the calibration control signal, wherein said second set of switches couple the input of each comparator to a voltage that is either higher or lower than a threshold voltage of the comparator in order to force the comparator to output a desired digital output signal.

\* \* \* \* \*